(12) United States Patent
Shim et al.

(10) Patent No.: US 7,723,981 B2
(45) Date of Patent: May 25, 2010

(54) METHOD FOR TRANSFERRING TEST TRAYS IN A SIDE-DOCKING TYPE TEST HANDLER

(75) Inventors: Jae Gyun Shim, Suwon-si (KR); Yun Sung Na, Cheonan-si (KR); In Gu Jeon, Suwon-si (KR); Tae Hung Ku, Suwon-si (KR); Dong Han Kim, Suwon-si (KR)

(73) Assignee: Techwing Co., Ltd. (KR)

( * ) Notice: Subject to any disclaimer, the term of this patent is extended or adjusted under 35 U.S.C. 154(b) by 0 days.

(21) Appl. No.: 12/389,469

(22) Filed: Feb. 20, 2009

(65) Prior Publication Data

US 2009/0153178 A1 Jun. 18, 2009

Related U.S. Application Data

(63) Continuation of application No. PCT/KR2007/000130, filed on Jan. 8, 2007.

(30) Foreign Application Priority Data

Aug. 22, 2006 (KR) ...................... 10-2006-0079575

(51) Int. Cl.
G01R 31/26 (2006.01)
G01R 31/28 (2006.01)
B07C 5/00 (2006.01)

(52) U.S. Cl. .................... 324/158.1; 324/755; 324/765; 209/573; 414/225.01; 414/935; 414/938

(58) Field of Classification Search ......... 324/754–765, 324/158.1; 209/573; 414/935–941, 222.01–226.05
See application file for complete search history.

(56) References Cited

U.S. PATENT DOCUMENTS 6,184,675 B1 * 2/2001 Bannai .................... 324/158.1

| 6,414,510 | B1 | 7/2002 | Takeuchi et al. | |
|---|---|---|---|---|
| 6,498,472 | B1 | 12/2002 | Lee et al. | |
| 6,844,717 | B2 * | 1/2005 | Shim et al. | 324/158.1 |
| 6,856,128 | B2 * | 2/2005 | Ito et al. | 324/158.1 |
| 7,196,508 | B2 * | 3/2007 | Ham et al. | 324/158.1 |
| 7,538,542 | B2 * | 5/2009 | Shim et al. | 324/158.1 |
| 2003/0085160 | A1 * | 5/2003 | Shim et al. | 209/573 |

FOREIGN PATENT DOCUMENTS

| KR | 10-1996-0018042 B1 | | 12/1997 |
|---|---|---|---|
| KR | 10-1996-0075495 B1 | * | 7/1999 |
| KR | 10-1998-0015706 B1 | * | 9/2000 |
| KR | 10-2000-0073278 A | * | 6/2002 |

(Continued)

Primary Examiner—Ha Tran T Nguyen
Assistant Examiner—Emily Y Chan
(74) Attorney, Agent, or Firm—BainwoodHuang

(57) ABSTRACT

The present invention relates to a test tray for a test handler. According to this invention, there is disclosed a technique that an insert loaded in a loading part which is arranged in a matrix pattern in a frame of the test tray allows an amount and direction of free movement thereof to be determined in accordance with a location of the loading part, where the insert is loaded, on the matrix, thereby enabling a thermal expansion or contraction of a match plate or the test tray to be compensated.

7 Claims, 14 Drawing Sheets

FOREIGN PATENT DOCUMENTS

| KR | 10-2001-0061539 | A | * | 4/2003 |
| KR | 10-2005-0124223 | B1 | * | 4/2007 |
| KR | 10-2006-0002203 | A | * | 7/2007 |
| KR | 10-2006-0028191 | A | * | 10/2007 |
| KR | 10-2006-0079575 | B1 | * | 1/2008 |

* cited by examiner

METHOD FOR TRANSFERRING TEST TRAYS IN A SIDE-DOCKING TYPE TEST HANDLER

This application is a Continuation Application of PCT International Application No. PCT/KR2007/000130 filed on Jan. 8, 2007, which designated the United States.

FIELD OF THE INVENTION

The present invention relates to a side-docking type test handler; and, more particularly, to a method for transferring test trays in the side-docking type test handler.

BACKGROUND OF THE INVENTION

In general, a test handler is an apparatus for assisting a tester to test semiconductor devices manufactured through predetermined manufacturing processes, and the test handler classifies the semiconductor devices by grade according to a test result. The test handler has been disclosed in several publications, e.g., Korean Patent Laid-open Publication No. 2003-0029266 entitled "Test handler".

Referring to FIG. 1, there is shown a conceptual diagram of a conventional side-docking type test handler as viewed from above. The side-docking type test handler includes a loading unit 11, a soak chamber 12, a test chamber 13, a desoak chamber 14, and an unloading unit 15. As illustrated in FIG. 1, the side-docking type test hander has a structure in which the soak chamber 12 is arranged at a back side of the loading unit 11 positioned on a left side in the test handler; the desoak chamber 14 is arranged at a back side of the unloading unit 15 positioned on a right side in the test handler; and the test chamber 13 is arranged at a back side of the soak chamber 12 and the desoak chamber 14.

In the loading unit 11, the semiconductor devices loaded on customer trays are transferred to a test tray and loaded thereon.

In the soak chamber 12, the test tray is translated toward the test chamber 13. While it is translated, the semiconductor devices loaded on the test tray are preheated or precooled depending on a preset test environment in the soak chamber 12.

In the test chamber 13, the test tray is transferred from the back side of the soak chamber 12 toward the back side of the desoak chamber 14. When the test tray is positioned at an approximately central portion C of the test chamber 13, the test tray is made to be closely attached to a tester 21 docked to a back side of the central portion C. Accordingly, the semiconductor devices loaded on the test tray are supplied to the tester 21 for testing (more specifically, the semiconductor devices are made to contact with contact sockets of the tester).

In the desoak chamber 14, the heated or cooled semiconductor devices transferred from the test chamber 13 are restored to a room temperature.

In the unloading unit 15, the semiconductor devices transferred from the desoak chamber 14 while being loaded on the test tray are classified by test grades and then transferred onto customer trays.

As described above, the semiconductor devices are transferred from the loading unit 11 to the unloading unit 15 via the soak chamber 12, the test chamber 13 and the desoak chamber 14, as indicated by an arrow a in FIG. 1. In this regard, the semiconductor devices are transferred from the loading unit 11 to the unloading unit 15 while being loaded on the test tray. This is because the test tray is designed to satisfy test conditions, whereas the customer tray is designed to densely load a large number of semiconductor devices so that a gap between semiconductor devices loaded on the customer tray does not satisfy the test conditions.

Since the semiconductor devices are transferred while being loaded on the test tray, the test tray needs to be transferred along a circulation path indicated by an arrow b beginning from the loading unit 11 and returning thereto via the soak chamber 12, the test chamber 13, the desoak chamber 14, and the unloading unit 15. The related arts of the test tray transfer method are disclosed in, e.g., Korean Patent Laid-open Publication No. 1997-0077466 entitled "TEST TRAY TRANSFER METHOD" (hereinafter, referred to as "prior art").

A continuously increasing demand for semiconductor devices has led to an increase in a processing amount per unit time of the test handler. Thus, there have arisen needs to increase the number of semiconductor devices to be tested at one time and improve a processing speed of the test handler. The present invention has a purpose of increasing the number of semiconductor devices that can be tested at one time.

SUMMARY OF THE INVENTION

It is, therefore, an object of the present invention to provide a method for transferring test trays in a side-docking type test handler, wherein semiconductor devices loaded on three test trays can be concurrently tested, thereby resulting in an increase in the number of semiconductor devices that can be tested at a time.

In accordance with an aspect of the present invention, there is provided a method for transferring test trays in a side-docking type test handler, the method comprising the steps of: (a) transferring a test tray in a horizontal posture from a loading unit to a test chamber via a soak chamber after semiconductor devices are loaded thereon, wherein the horizontal posture of the test tray is changed to a vertical posture at a point while it is transferred; (b) vertically arranging in three rows three test trays sequentially transferred to the test chamber in the step (a); (c) transferring the three test trays vertically arranged in the three rows in the step (b) to a test position; (d) transferring each of the three test trays from the test chamber to an unloading unit via a desoak chamber after a test for semiconductor devices loaded on the three test trays is completed, wherein the vertical posture of the test tray is changed to the horizontal posture at a point while it is transferred; and (e) transferring each of the test trays transferred to the unloading unit in the step (d) to the loading unit after the semiconductor devices are unloaded therefrom.

The step (a) may include the steps of: (a1) transferring the test tray in the horizontal posture from the loading unit into the soak chamber; (a2) changing the horizontal posture of the test tray transferred into the soak chamber in the step (a1) to the vertical posture; (a3) lowering the test tray in the vertical posture obtained in the step (a2) downward to a predetermined position; and (a4) translating the test tray moved downward to the predetermined position in the step (a3) to the test chamber. Further, in the step (a4), the test tray is translated to a middle position of the test chamber, and in the step (b), the three test trays sequentially translated to the test chamber in the step (a4) are arranged at an upper, a lower and the middle position in that order or at the lower, the upper and the middle position in that order. Alternatively, in the step (a4), the test tray is translated to a lower position of the test chamber, and in the step (b), the three test trays sequentially translated to the test chamber in the step (a4) are arranged at an upper, a middle and the lower position in that order.

The step (a) may include the steps of: (a1) transferring the test tray in the horizontal posture from a loading unit into the soak chamber and arranging the test trays sequentially transferred into the soak chamber in two vertical rows, wherein the horizontal posture of the test tray is changed to the vertical posture at a point while it is transferred and arranged; and (a2) translating the test trays that have been arranged in the two vertical rows in the step (a1) to the test chamber. Further, in the step (a2), the test trays are translated to a middle position and a lower position of the test chamber, and in the step (b), among the three test trays, two test trays sequentially translated to the middle position of the test chamber are arranged at an upper and the middle position in that order and one test tray translated to the lower position of the test chamber is arranged at the lower position. Alternatively, in the step (a2), the test trays are translated to an upper and a lower position of the test chamber, and in the step (b), among the three test trays, one test tray translated to the upper position of the test chamber is arranged at the upper position and two test trays sequentially translated to the lower position of the test chamber are arranged at a middle and the lower position in that order. Substitutively, in this case, in the step (b), among the three test trays, two test trays sequentially translated to the upper position of the test chamber are arranged at a middle and the upper position in that order and one test tray translated to the lower position of the test chamber is arranged at the lower position.

The step (a) may includes the steps of: (a1) transferring the test tray in the horizontal posture from the loading unit into the soak chamber; (a2) translating the test tray transferred into the soak chamber in the step (a1) downward to a predetermined position; and (a3) changing the horizontal posture of the test tray to the vertical posture and transferring the test tray in the vertical posture to the test chamber. Further, in the step (a3), the test tray is transferred to a middle position of the test chamber, and in the step (b), the three test trays sequentially transferred to the test chamber in the step (a3) are arranged at an upper, a lower and the middle position in that order or at the lower, the upper and the middle position in that order. Alternatively, in the step (a3), the test tray is transferred to a lower position of the test chamber, and in the step (b), the three test trays sequentially transferred to the test chamber in the step (a3) are arranged at an upper, a middle and the lower position in that order.

In accordance with the present invention, the test handler can assist a tester to test semiconductor devices loaded on three test trays concurrently, thereby resulting in an increase in the number of semiconductor devices that can be tested at a time. Accordingly, a processing speed of the test handler is improved.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE EMBODIMENTS

Hereinafter, test tray transfer methods in a side-docking type test handler in accordance with preferred embodiments of the present invention will be described in detail with reference to the accompanying drawings.

First Preferred Embodiment

Figure 1:
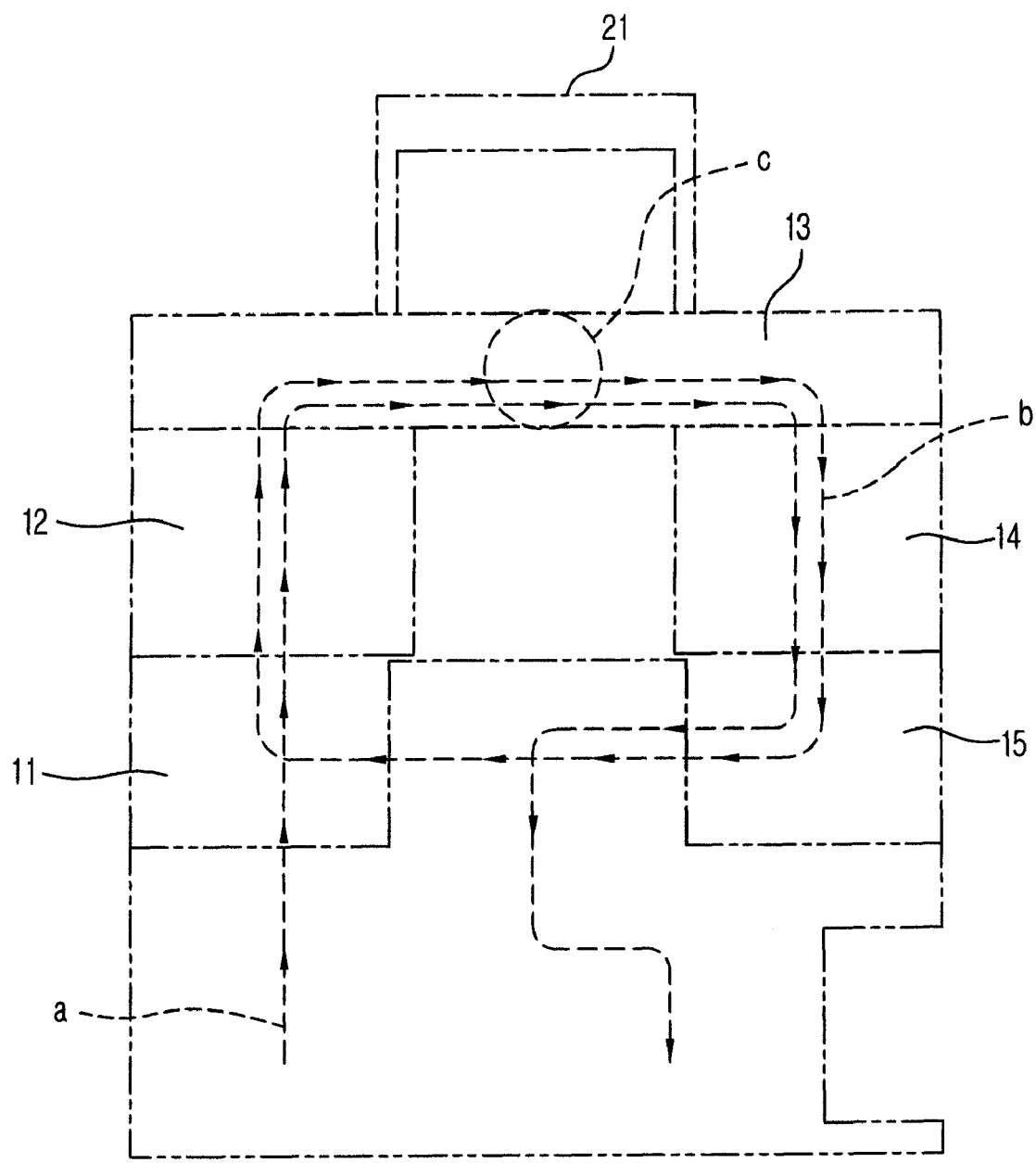
FIG. 1 is a top view showing a transfer path of semiconductor devices and a test tray in a general side-docking type test handler.
Figure 2:
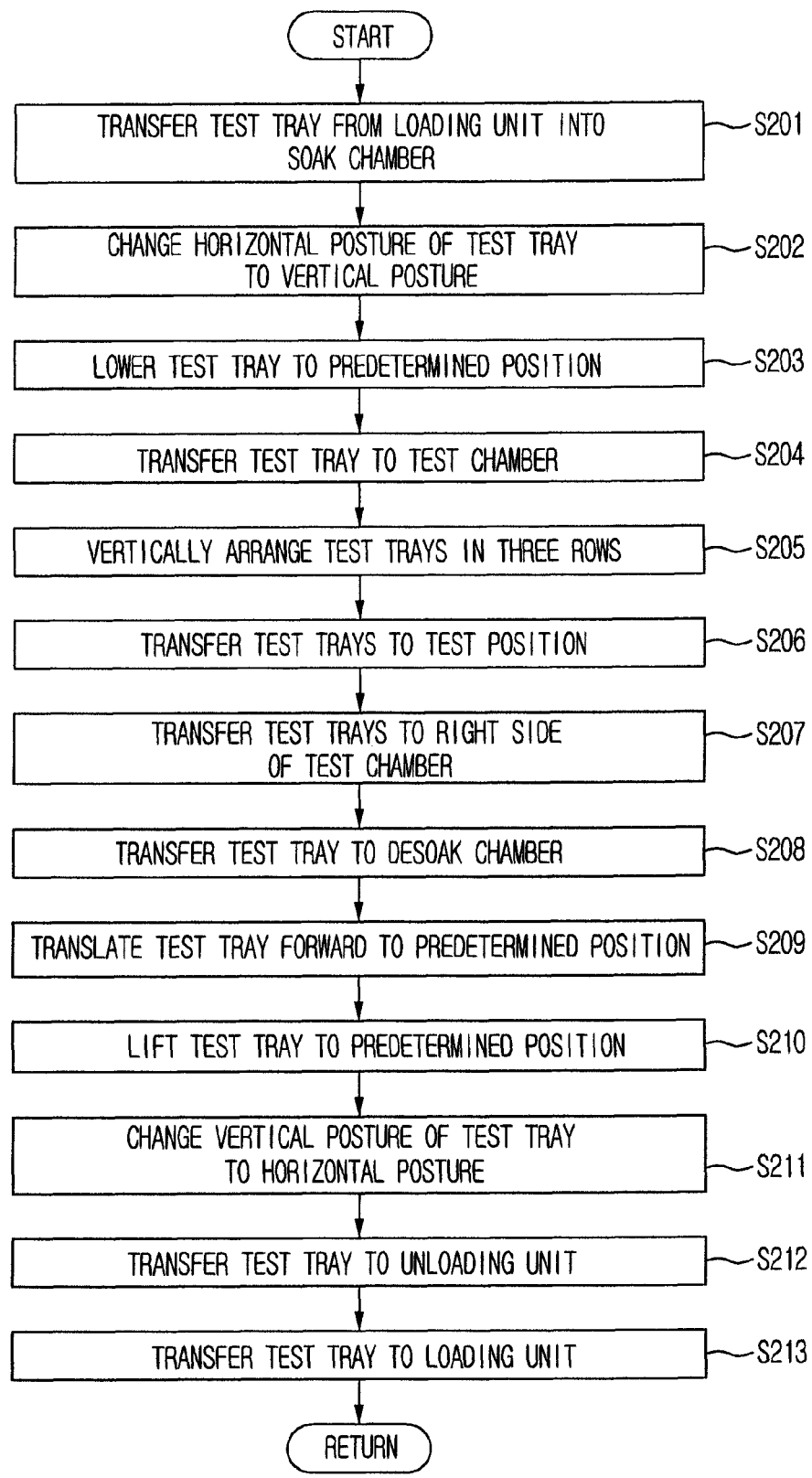
FIG. 2 provides a flowchart of a method for transferring test trays in a side-docking type test handler in accordance with a first preferred embodiment of the present invention.
Figure 3:
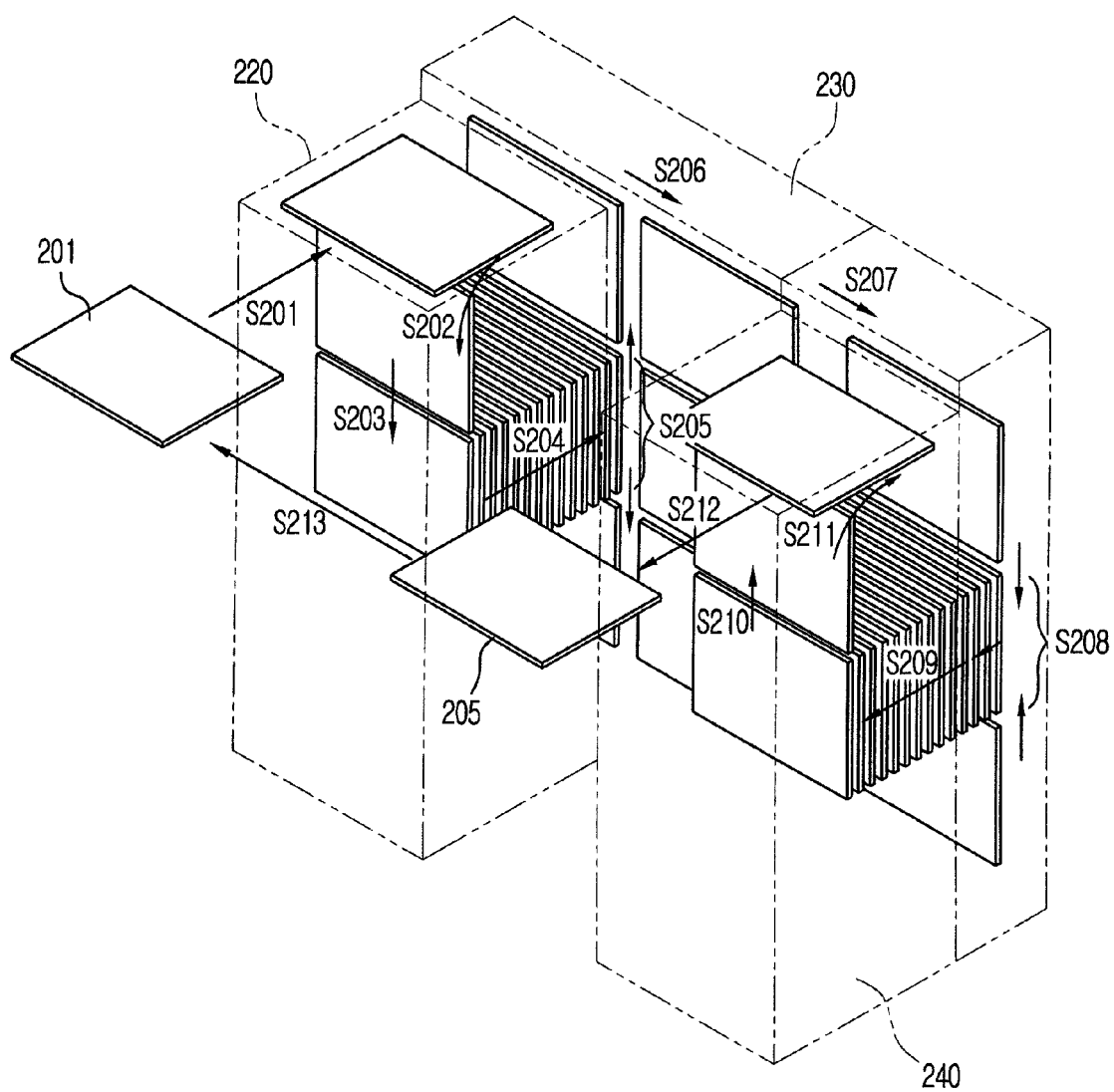
FIGS. 3 to 6B present diagrams for explaining the test tray transfer method of FIG. 2.

FIG. 2 shows a flowchart of a method for transferring test trays in a side-docking type test handler in accordance with a first preferred embodiment of the present invention. FIG. 3 is a conceptual diagram illustrating a state where the test trays are transferred in the side-docking type test handler in accordance with the test tray transfer method of FIG. 2. Hereinafter, the test tray transfer method in accordance with the first preferred embodiment of the present invention will be described with reference to FIGS. 2 and 3.

After semiconductor devices are loaded onto a test tray 201 positioned in a loading unit, the test tray in a horizontal posture is transferred into a soak chamber 220 (step S201).

Next, the horizontal posture of the test tray that has been transferred into the soak chamber 220 in the step S201 is changed to a vertical posture (step S202).

The steps S201 and S202 have been disclosed in Korean Patent Application No. 10-2005-0124223 (Korean Patent No. 10-074106) entitled "Test handler and an operation method thereof", which had been previously filed by the present applicant. In this method, it is possible to reduce time required for testing semiconductor devices since the semiconductor devices loaded on the test tray are preheated or precooled even while the posture of the test tray is changed unlike the prior art.

Thereafter, the test tray in the vertical posture obtained in the step S202 is lowered to a predetermined position (step S203). Herein, the predetermined position approximately corresponds to a middle position of the test chamber 230 in a vertical direction.

The test tray, moved downward to the predetermined position in the step S203, is translated backward step by step to finally reach the middle position of the test chamber 230 (step S204). As can be seen from FIG. 3, the test tray translated to the test chamber 230 from the soak chamber 220 is located at a left side in the test chamber 230.

Three test trays that have been sequentially translated to the middle position of the test chamber 230 in the step S204 are arranged vertically in three rows, i.e., at an upper, a lower and the middle position in that order (step S205). This will be described in detail with reference to FIGS. 4A to 4D.

Figure 4A:
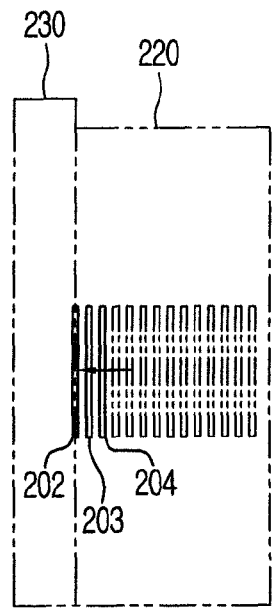
Figure 4B:
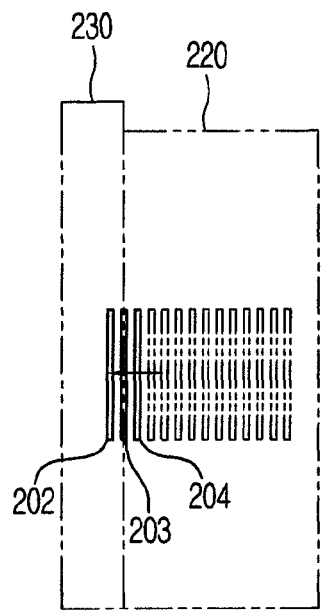
Figure 4C:
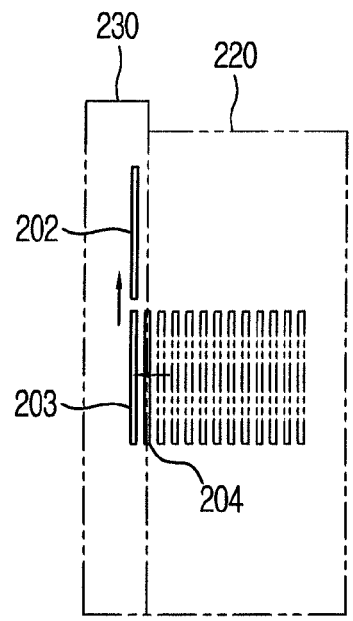
Figure 4D:
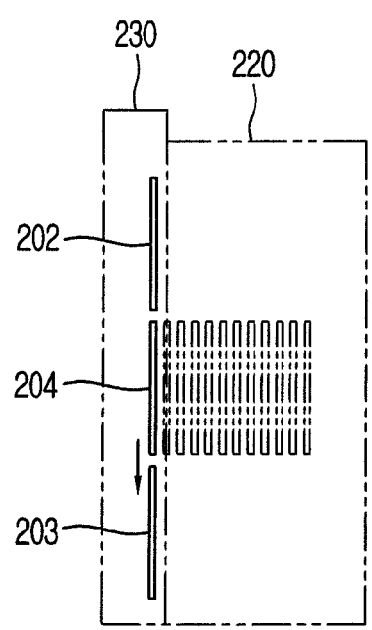

FIGS. 4A to 4D are left side views of the test tray transfer state as shown in FIG. 3, in which three test trays are illustrated in bold for convenience of explanation. As illustrated in FIGS. 4A and 4B, the test trays preheated or precooled in the soak chamber 220 are translated step by step to finally reach the test chamber 230. At this time, a test tray 202 first arrived at the middle position of the test chamber 230 is lifted to the upper position of the test chamber 230 as shown in FIG. 4C. A test tray 203 secondly arrived at the middle position of the test chamber 230 is lowered to the lower position of the test chamber 230 as illustrated in FIG. 4D. Then, a test tray 204 is thirdly arrived at the middle position as shown in FIG. 4D. Consequently, the three test trays sequentially translated from the soak chamber 220 to the test chamber 230 are arranged vertically in three rows. Alternatively, the three test trays may be arranged vertically at the lower, the upper and the middle position in that order.

Next, the three test trays arranged vertically in the three rows in the step S205 are transferred to a test position corresponding to a central portion of the test chamber 230 (step S206).

Thereafter, the semiconductor devices loaded on the three test trays are tested in the test position corresponding to the central portion of the test chamber 230 in the step S206, and the three test trays are then transferred to a right side in the test chamber 230, i.e., to a back side of the desoak chamber 240 (step S207).

Among the three test trays transferred to the back side of the desoak chamber 240 in the step S207, the test tray at the middle position is transferred forward to the desoak chamber 240 and the test trays at the upper and lower position are sequentially transferred to the middle position and then transferred to the desoak chamber 240. Consequently, the test trays arranged vertically in the three rows are sequentially transferred to the desoak chamber 240 (step S208). Alternatively, the test trays at the lower and the upper position are sequentially transferred to the middle position and then transferred to the desoak chamber 240.

Next, the test tray transferred from the test chamber 230 to the desoak chamber 240 in the step S208 is translated forward to a predetermined position step by step (step S209).

Then, the test tray translated to the predetermined position in the step S209 is lifted upward to a prearranged position (step S210).

Thereafter, the vertical posture of the test tray lifted upward is changed to the horizontal posture (step S211).

The test tray in the horizontal posture obtained in the step S211 is transferred to the unloading unit, so that it is disposed as indicated by reference numeral 205 (step S212).

After the semiconductor devices are unloaded from the test tray transferred to the unloading unit in the step S212, the test tray is then transferred to the loading unit, so that it is disposed as indicated by reference numeral 201.

(Modification of the First Preferred Embodiment)

Figure 5:
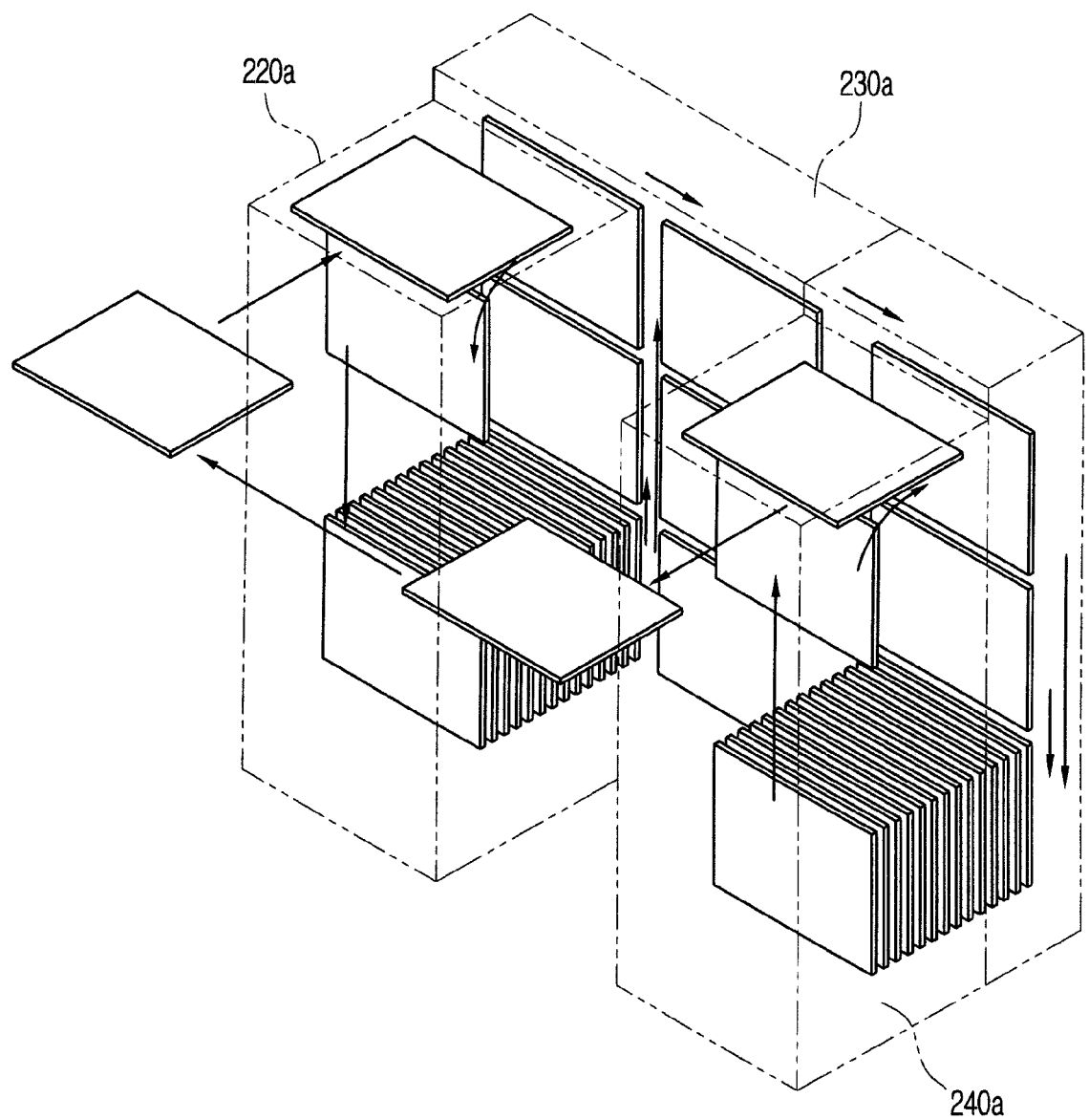

FIG. 5 shows a modification of the first preferred embodiment. Referring to FIG. 5, in case the test tray transferred from the loading unit into the soak chamber 220a is lowered to a predetermined position after its horizontal posture is changed to the vertical posture, the test tray is lowered to a position corresponding to the lower position of the test chamber 230a in the vertical direction and then translated to the lower position of the test chamber 230a. Accordingly, the test tray is transferred to the lower position of the test chamber 230a from the soak chamber 220a. In this case, the three test trays sequentially translated to the test chamber 230a are arranged vertically at the upper, the middle and the lower position in that order. When the test trays are transferred from the test chamber 230a to the desoak chamber 240a, they are preferably transferred in the order of the trays at the lower, the middle and the upper position.

Figure 6A:
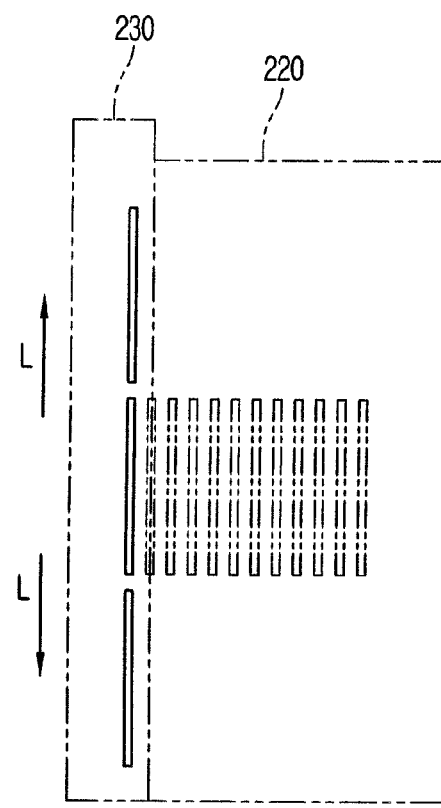
Figure 6B:
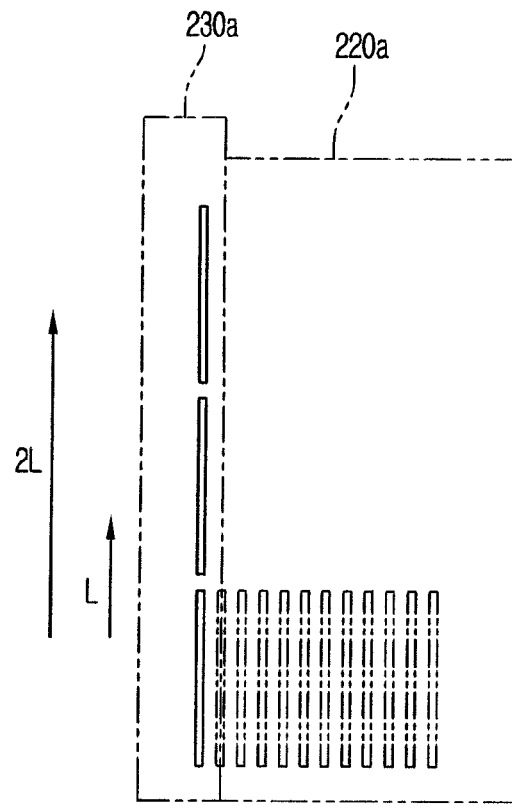

The first preferred embodiment shown in FIG. 3 and the modification thereof shown in FIG. 5 are different from each other in time required for vertically arranging three test trays in three rows. Referring to FIG. 6A, in case of the first preferred embodiment shown in FIG. 3, a total moving distance required to vertically arrange three test trays in three rows corresponds to 2L. However, referring to FIG. 6B, in case of the modification shown in FIG. 5, a total moving distance required to vertically arrange three test trays in three rows corresponds to 3L (this is true when the test trays are transferred from the test chamber to the desoak chamber). The difference in the moving distance is related to the time for vertically arranging the test trays in three rows, so that a processing speed of the test handler increases in case of employing the transfer method of FIG. 3.

Second Preferred Embodiment

Figure 7:
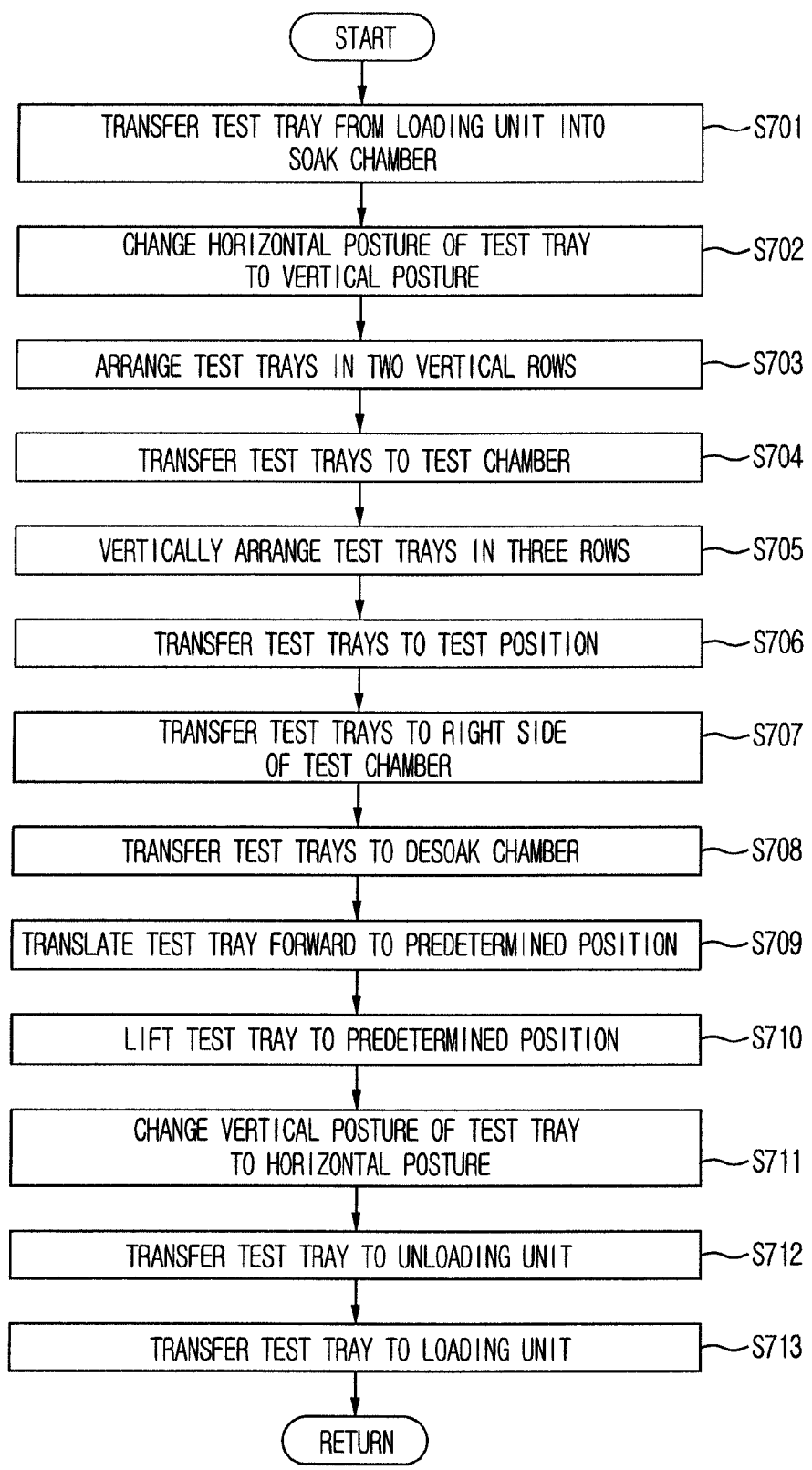
FIG. 7 represents a flowchart of a method for transferring test trays in a side-docking type test handler in accordance with a second preferred embodiment of the present invention.
Figure 8:
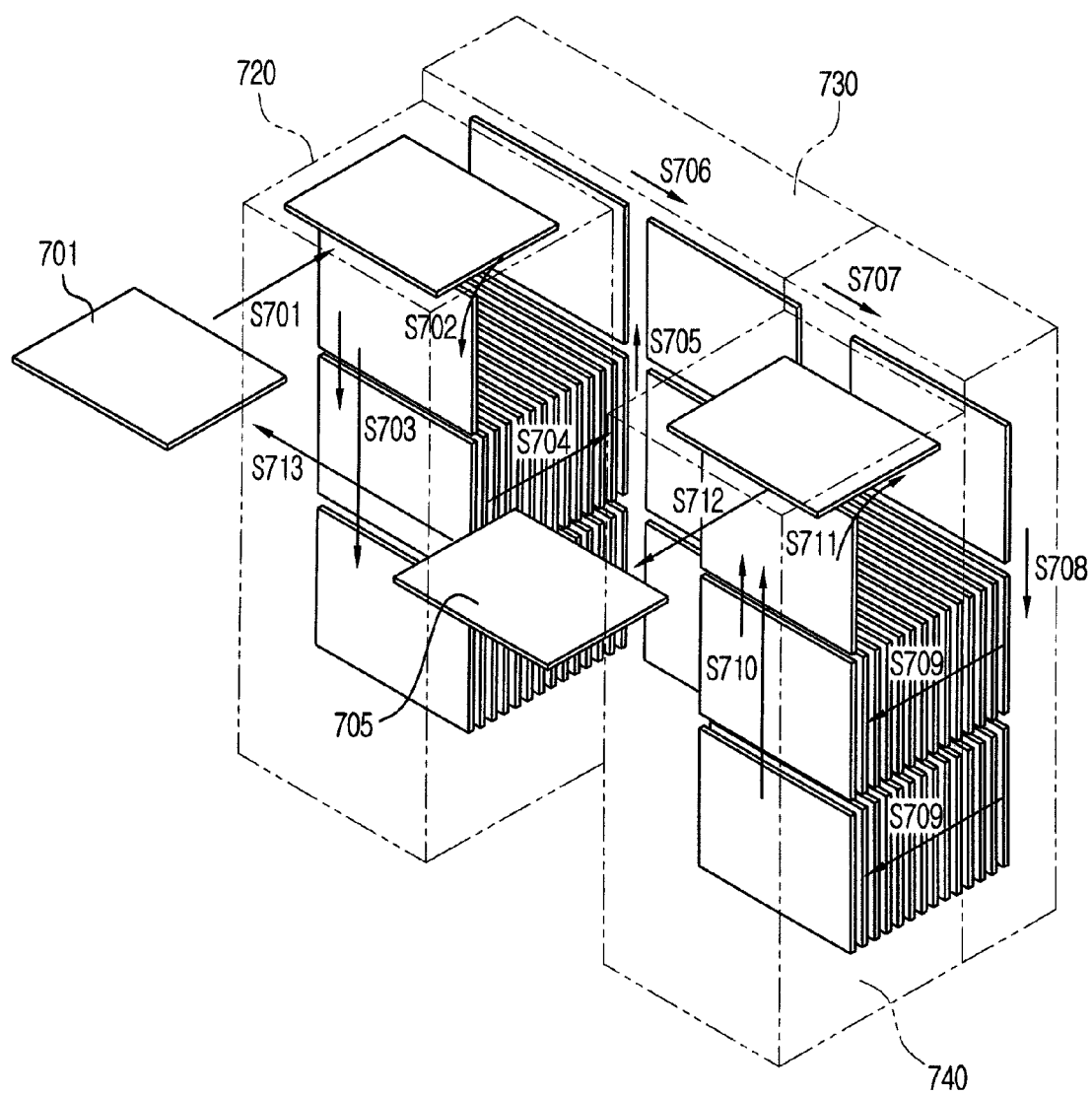
FIGS. 8 to 10B offer diagrams for explaining the test tray transfer method of FIG. 7.

FIG. 7 presents a flowchart of a test tray transfer method in accordance with a second preferred embodiment of the present invention. FIG. 8 represents a conceptual diagram of a side-docking type test handler employing the transfer method of FIG. 7. Hereinafter, the test tray transfer method in accordance with the second preferred embodiment of the present invention will be described with reference to FIGS. 7 and 8.

After semiconductor devices are loaded onto a test tray 701 positioned in a loading unit, the test tray in a horizontal posture is transferred into a soak chamber 720 (step S701).

Next, the horizontal posture of the test tray transferred into the soak chamber 220 in the step S701 is changed to a vertical posture (step S702).

Thereafter, the test trays in the vertical posture sequentially obtained in the step S702 are lowered and arranged in two vertical rows, i.e., an upper and a lower row (step S703). Herein, the positions of the test trays arranged in the two rows approximately correspond to a middle and a lower position of the test chamber 730 in a vertical direction.

The test trays arranged in the two vertical rows in the step S703 are translated backward step by step to finally reach the middle and the lower position of the test chamber 730 (step S704).

The test tray translated to the lower position of the test chamber 730 in the step S704 is maintained at the lower position. Further, two test trays sequentially translated to the middle position are arranged at an upper and the middle position in the order of transfer. Consequently, the three test trays translated from the soak chamber 720 to the test chamber 730 are arranged vertically in three rows in the test chamber 730 (step s705). To that end, the number of the test trays translated from the soak chamber 720 to the middle position of the test chamber 730 is required to be twice the number of the test trays translated from the soak chamber 720 to the lower position of the test chamber 730, and the test trays whose postures are changed in the step S702 need to be arranged in the two rows in the step S703 in a suitable manner to the above requirement.

Next, the three test trays arranged in the three rows in the step S705 are transferred to a test position corresponding to a central portion of the test chamber 730 (step S706).

Thereafter, the semiconductor devices loaded on the three test trays are tested in the test position corresponding to the central portion of the test chamber 230 in the step S706, and the three test trays are then transferred to a right side in the test chamber 730, i.e., to a back side of a desoak chamber 740 (step S707).

Among the three test trays transferred to the back side of the desoak chamber 740 in the step S707, the test trays at the middle and the lower position are transferred to the desoak chamber 740 as they are, and the test tray at the upper position is lowered to the middle position and then transferred to the desoak chamber 240 (step S708). Accordingly, the test trays can be translated forward in a state where they are arranged in two rows in the desoak chamber 740.

Next, the test trays transferred in the two rows from the test chamber 230 to the desoak chamber 240 in the step S708 are translated forward to a predetermined position step by step (step S709).

Then, the test tray translated forward to the predetermined position in the step S709 is lifted upward to a prearranged position (step S710).

Thereafter, the vertical posture of the test tray lifted upward in the step S710 is changed to the horizontal posture (step S711).

The test tray in the horizontal posture obtained in the step S711 is transferred to an unloading unit, so that it is disposed as indicated by reference numeral 705 (step S712).

After the semiconductor devices are unloaded from the test tray transferred to the unloading unit in the step S712, the test tray is transferred to the loading unit, so that it is disposed as indicated by reference numeral 701 (step S713).

In accordance with the second preferred embodiment, it is possible to further reduce the time required to vertically arrange the test trays in three rows in the test chamber 730. Therefore, a higher processing speed can be realized in comparison with the first preferred embodiment and the modification thereof.

Although the horizontal posture of the test tray in the second preferred embodiment is changed to the vertical posture in the soak chamber 720, the test tray may be transferred into the soak chamber after its posture is changed to the vertical posture above the soak chamber as in the prior art.

(Modification of the Second Preferred Embodiment)

Figure 9:
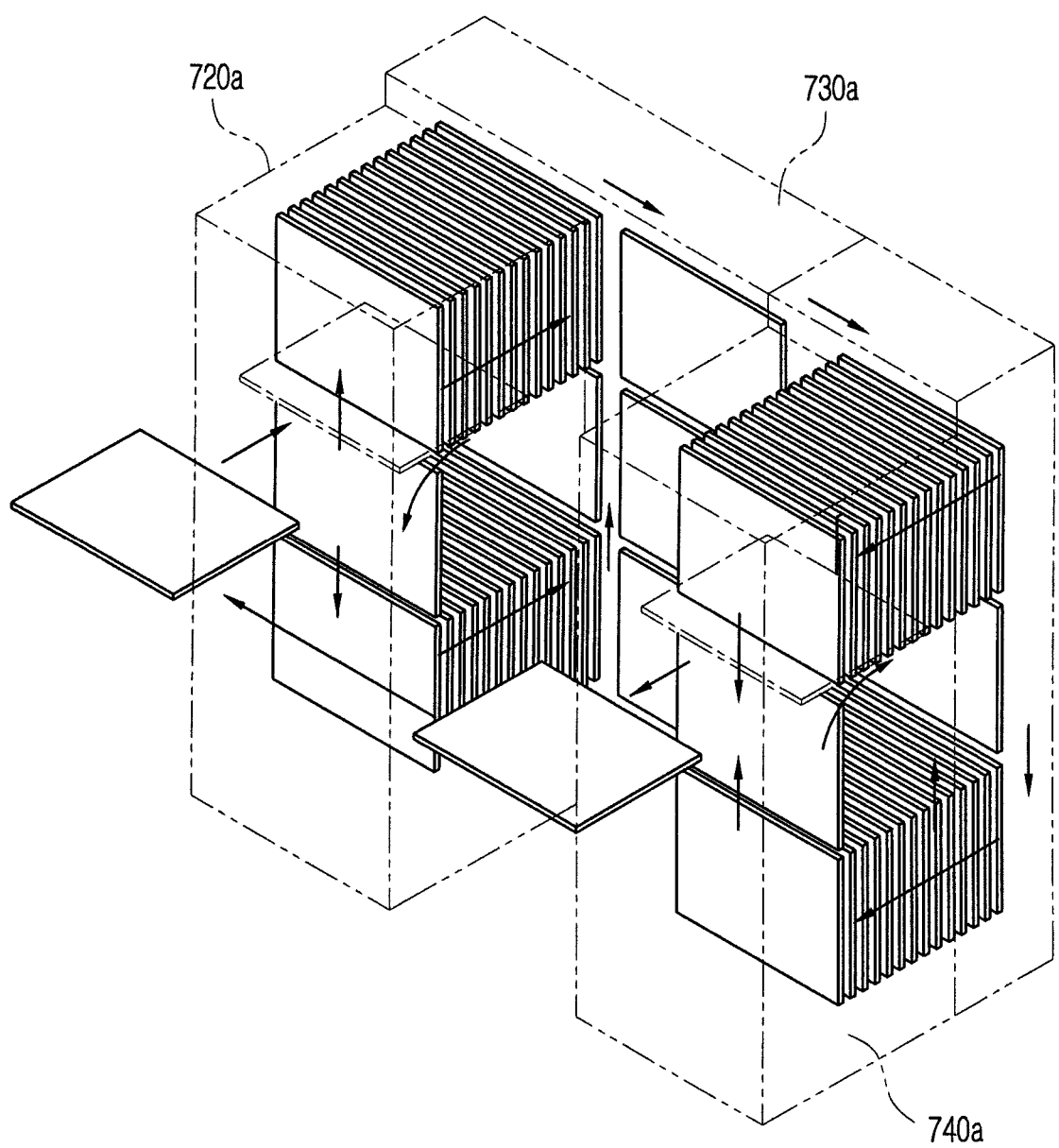

FIG. 9 describes a modification of the second preferred embodiment. Referring to FIG. 9, positions of a loading unit and an unloading unit correspond to a middle position of a test chamber 730*a* in a vertical direction. Further, respective positions where the test trays change the posture thereof in a soak chamber 720*a* and a desoak chamber 740*a* correspond to the middle position of the test chamber 730*a* in a vertical direction.

In case the test trays sequentially transferred from the loading unit into the soak chamber 720*a* are arranged in two rows after changing their horizontal posture to the vertical posture, the positions of the test trays arranged in the two vertical rows approximately correspond to an upper position and a lower position of the test chamber 730*a* in the vertical direction. The test trays arranged in the two rows are translated backward step by step to finally reach the upper and the lower position of the test chamber 730*a*. The test tray translated to the upper position of the test chamber 730*a* is maintained at the upper position. Further, two test trays sequentially translated to the lower position are arranged at the middle and the lower position in the order of transfer. Consequently, the three test trays translated from the soak chamber 720*a* to the test chamber 730*a* are arranged vertically in three rows in the test chamber 730*a*. To that end, the number of the test trays translated from the soak chamber 720*a* to the lower position of the test chamber 730*a* is required to be twice the number of the test trays translated from the soak chamber 720*a* to the upper position of the test chamber 730*a*, and the test trays in the vertical posture need to be appropriately arranged in the two rows in a suitable manner to the requirement. Among the three test trays transferred to a back side of the desoak chamber 740*a*, the test trays at the upper and the lower position are transferred to the desoak chamber 740*a* as they are, and the test tray at the middle position is lowered to the lower position and then transferred to the desoak chamber 240*a*. Accordingly, the test trays can be translated forward in a state where they are arranged in two rows in the desoak chamber 740*a*.

Figure 10A:
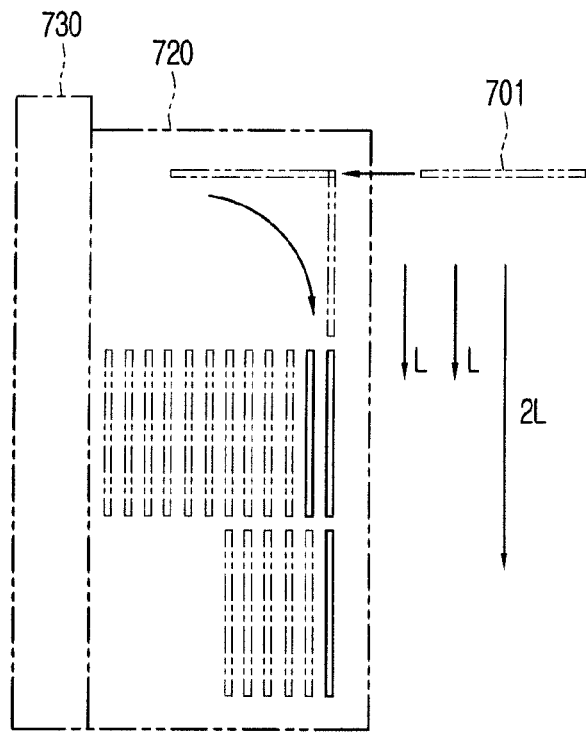
Figure 10B:
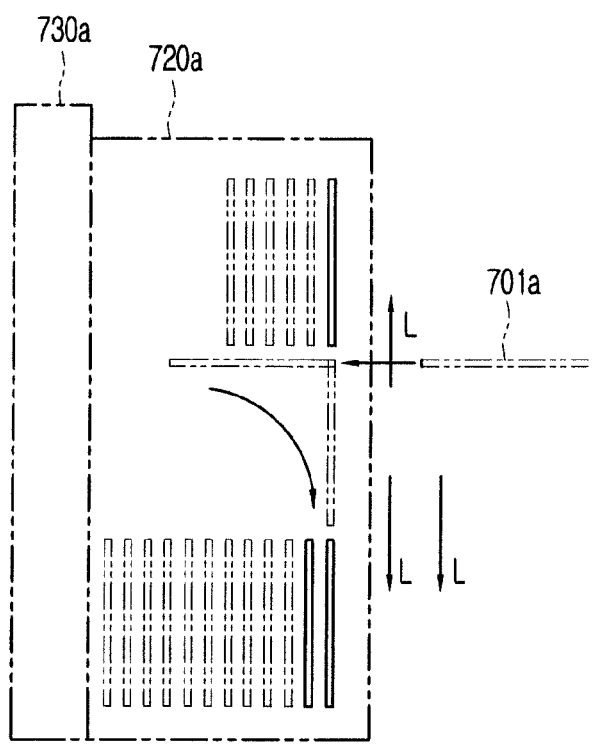

The second preferred embodiment shown in FIG. 8 and the modification thereof shown in FIG. 9 are different from each other in time required for arranging test trays in two vertical rows. Referring to FIG. 10A, a total moving distance for arranging three test trays 701 in two rows corresponds to 4L in the second preferred embodiment of FIG. 8. Meanwhile, referring to FIG. 10B, a total moving distance for arranging three test tray 701*a* in two rows corresponds to 3L in the modification of FIG. 9 (this is true when the test trays are transferred from the desoak chamber to the unloading unit). The difference in the moving distance is related to the time for arranging test trays in two rows, so that a processing speed of the test handler increases in case of employing the transfer method of FIG. 9.

In case the test trays are arranged in two rows corresponding to the upper and the lower position of the test chamber, it is also possible that two test trays sequentially translated to the upper position of the test chamber are arranged at the middle and the upper position in the order of transfer and, further, the test tray translated to the lower position is maintained at the same position. Accordingly, the three test trays translated from the soak chamber to the test chamber are arranged vertically in three rows in the test chamber. Thereafter, the test trays in the three rows at a back side of the desoak chamber are arranged in two rows through a reverse process of the above and then translated in the desoak chamber.

Third Preferred Embodiment

Figure 11:
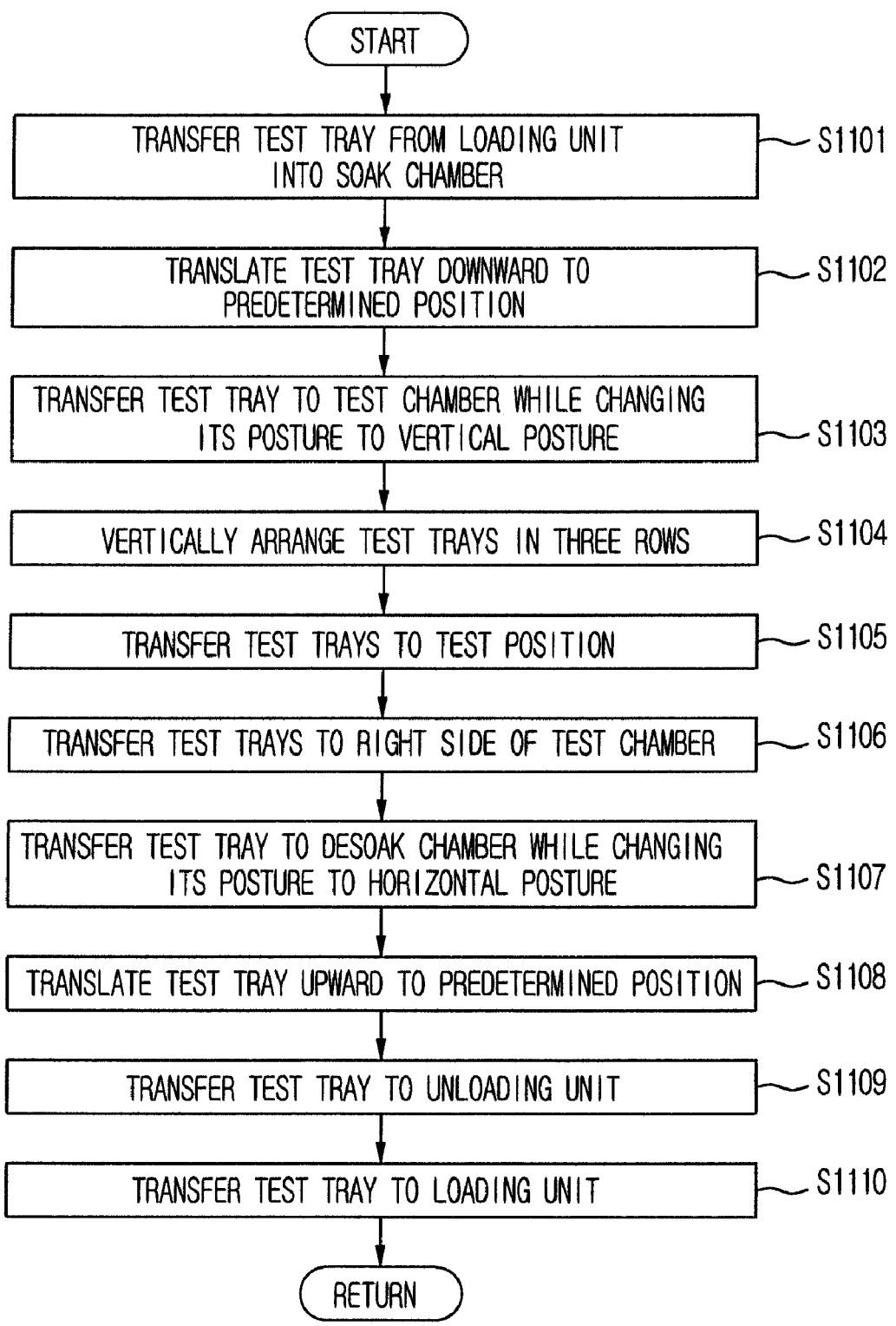
FIG. 11 is a flowchart of a method for transferring test trays in a side-docking type test handler in accordance with a third preferred embodiment of the present invention.
Figure 12:
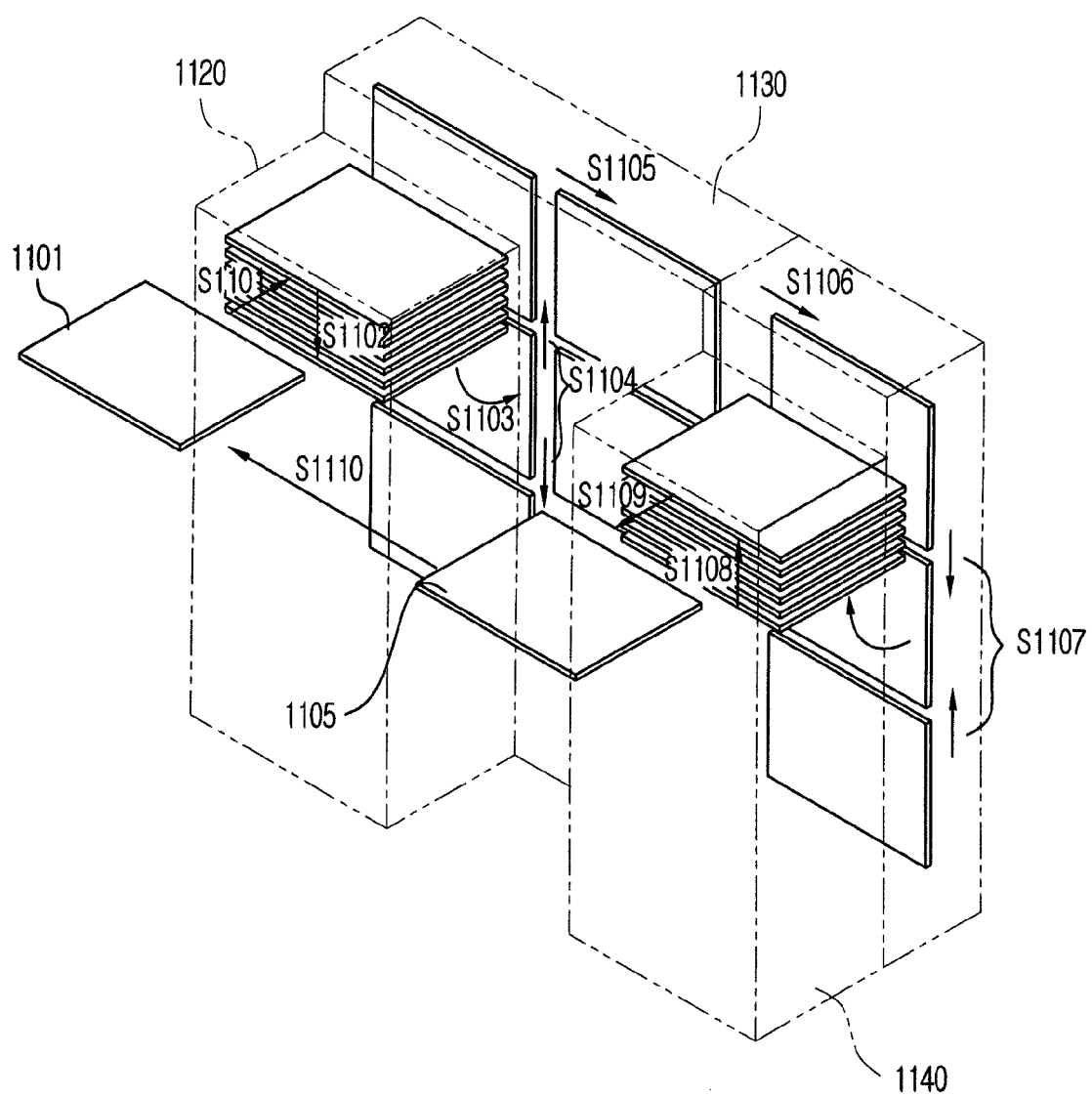
FIGS. 12 and 13 depict diagrams for explaining the test tray transfer method of FIG. 11.

FIG. 11 provides a flowchart of a test tray transfer method in accordance with a third preferred embodiment of the present invention. FIG. 12 presents a conceptual diagram showing a transfer state of test trays in a side-docking type test handler employing the transfer method of FIG. 11. Hereinafter, the test tray transfer method in accordance with the third preferred embodiment of the present invention will be described with reference to FIGS. 11 and 12.

After semiconductor devices are loaded onto a test tray 1101 positioned in a loading unit, the test tray in a horizontal posture is transferred into a soak chamber 1120 (step S1101).

Next, the horizontal test tray transferred into the soak chamber 1120 in the step S1101 is translated downward to a predetermined position (step S1102).

Thereafter, the test tray translated downward to the predetermined position in the step S1102 is transferred to a test chamber 1130 while changing its horizontal posture to a vertical posture (step S1103). Referring to FIG. 12, the test tray transferred to the test chamber 1130 from the soak chamber 1120 while changing its posture is transferred approximately to a middle position of the test chamber 1130 in a vertical direction.

The test tray transfer method in accordance with the steps S1101 and S1102 has been disclosed in Korean Patent Application No. 10-2006-0028191 entitled Method for transferring test trays in a side-docking type test handler which had been previously filed by the present applicant. In accordance with this method, the test tray transferred into the soak chamber is lowered downward in the horizontal posture and its posture is then changed to the vertical, so that there are obtained a shortened circulation path of the test tray, a reduced size of the test handler and the like in comparison with the prior art.

The test trays sequentially transferred to the middle position of the test chamber 1130 in the step S1103 are arranged in three rows, i.e., an upper, a lower and the middle position in that order (step S1104). Alternatively, the three test trays may be arranged at the lower, the upper and the middle position in that order.

Next, the three test trays arranged in the three vertical rows in the step S1104 are transferred to a test position corresponding to a central portion of the test chamber 1130 (step S1105).

After completing the test for the semiconductor devices loaded on the three test trays located at the test position corresponding to the central portion of the test chamber 1130 in the step S1105, the three test trays are then transferred to a right side in the test chamber 1130, i.e., to a back side of the desoak chamber 1140 (step S1106).

Among the three test trays transferred to the back side of the desoak chamber 1140 in the step S1106, the test tray at the middle position is transferred to the desoak chamber 1140 while its vertical posture is changed to the horizontal posture and, then, the test trays at the upper and the lower position are moved to the middle position and then transferred to the desoak chamber 240 while changing their postures in that order or a reverse order. As a result, the test trays arranged in three rows are transferred to the desoak chamber 1140 while changing their vertical postures to the horizontal postures (step S1107).

Next, the test tray transferred from the test chamber 1130 to the desoak chamber 1140 while changing its posture in the step S1107 is translated upward to a predetermined position step by step (step S1108).

Then, the test tray translated upward to the predetermined position in the step S1108 is transferred to an unloading unit, so that it is disposed as indicated by reference numeral 1105 (step S1109).

After the semiconductor devices are unloaded from the test tray transferred to the unloading unit in the step S1109, the test tray is transferred to the loading unit, so that is disposed as indicated by reference numeral 1101 (step S1110).

(Modification of the Third Preferred Embodiment)

Figure 13:
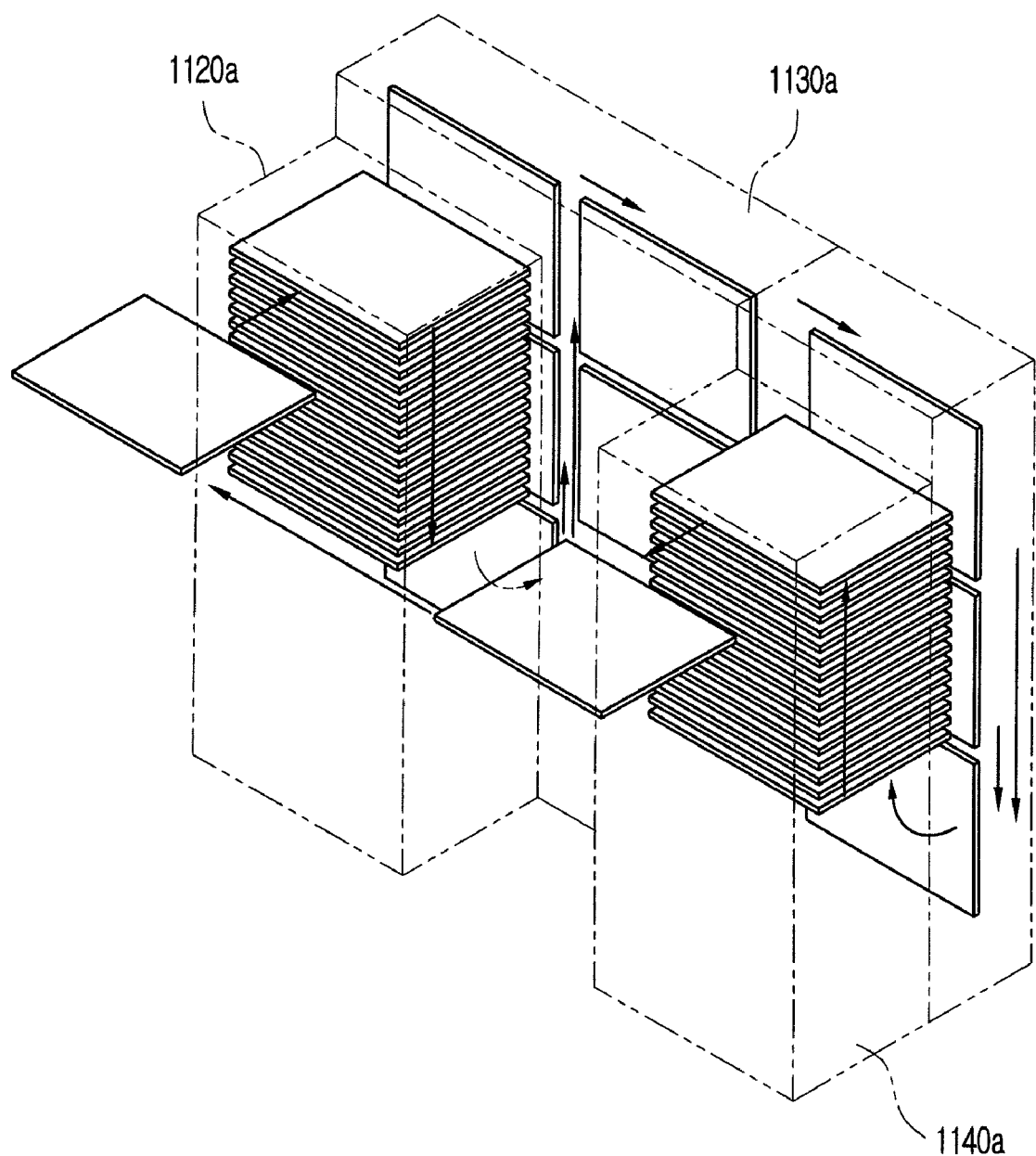

FIG. 13 describes a modification of the third preferred embodiment. Referring to FIG. 13, in case a test tray translated downward to a predetermined position is transferred from a soak chamber 1120*a* to a test chamber 1130*a* while changing its posture, the test tray is transferred to a lower position of the test chamber 1130*a* in a vertical direction. At this time, the three test trays sequentially transferred to the test chamber 1130*a* are arranged in three rows, i.e., an upper, an middle and the lower position in that order. This is true when test trays are transferred from the test chamber 1130*a* to a desoak chamber 1140*a*.

Although the transfers in the soak chamber and the desoak chamber are made to be symmetrical to each other in the aforementioned embodiments as in a conventional method, the transfers in the soak chamber and the desoak chamber can be made differently to each other as desired.

The test tray transfer method described above can be variously modified without departing the scope of the present invention. Accordingly, while the invention has been shown and described in detail with respect to the preferred embodiments, the present invention is not limited thereto and the scope of the present invention should be interpreted by using the following claims and equivalents thereof.

What is claimed is:

1. A method for transferring test trays in a side-docking type test handler, the method comprising the steps of:
   (a) transferring a test tray in a horizontal posture from a loading unit to a test chamber via a soak chamber after semiconductor devices are loaded there on, wherein the horizontal posture of the test tray is changed to a vertical posture at a point while it is transferred;
   (b) vertically arranging in three rows three test trays sequentially transferred to the test chamber in the step (a);
   (c) transferring the three test trays vertically arranged in the three rows in the step (b) to a test position;
   (d) transferring each of the three test trays from the test chamber to an unloading unit via a desoak chamber after a test for semiconductor devices loaded on the three test trays is completed, wherein the vertical posture of the test tray is changed to the horizontal posture at a point while it is transferred; and
   (e) transferring each of the test trays transferred to the unloading unit in the step (d) to the loading unit after the semiconductor devices are unloaded therefrom,
   wherein the step (a) includes the steps of:
      (a1) transferring the test tray in the horizontal posture from the loading unit into the soak chamber;
      (a2) changing the horizontal posture of the test tray transferred into the soak chamber in the step (a1) to the vertical posture;
      (a3) lowering the test tray in the vertical posture obtained in the step (a2) downward to a predetermined position; and
      (a4) translating the test tray moved downward to the predetermined position in the step (a3) to the test chamber; and
   wherein in the step (a4), the test tray is translated to a middle position of the test chamber, and in the step (b), the three test trays sequentially translated to the test chamber in the step (a4) are arranged at an upper, a lower and the middle position in that order or at the lower, the upper and the middle position in that order.

2. A method for transferring test trays in a side-docking type test handler, the method comprising the steps of:
   (a) transferring a test tray in a horizontal posture from a loading unit to a test chamber via a soak chamber after semiconductor devices are loaded there on, wherein the horizontal posture of the test tray is changed to a vertical posture at a point while it is transferred;
   (b) vertically arranging in three rows three test trays sequentially transferred to the test chamber in the step (a);
   (c) transferring the three test trays vertically arranged in the three rows in the step (b) to a test position;
   (d) transferring each of the three test trays from the test chamber to an unloading unit via a desoak chamber after a test for semiconductor devices loaded on the three test trays is completed, wherein the vertical posture of the test tray is changed to the horizontal posture at a point while it is transferred; and
   (e) transferring each of the test trays transferred to the unloading unit in the step (d) to the loading unit after the semiconductor devices are unloaded therefrom,
   wherein the step (a) includes the steps of:
      (a1) transferring the test tray in the horizontal posture from the loading unit into the soak chamber;
      (a2) changing the horizontal posture of the test tray transferred into the soak chamber in the step (a1) to the vertical posture;
      (a3) lowering the test tray in the vertical posture obtained in the step (a2) downward to a predetermined position; and (a4) translating the test tray moved downward to the predetermined position in the step (a3) to the test chamber; and wherein in the step (a4), the test tray is translated to a lower position of the test chamber, and in the step (b), the three test trays sequentially translated to the test chamber in the step (a4) are arranged at an upper, a middle and the lower position in that order.

3. A method for transferring test trays in a side-docking type test handler, the method comprising the steps of:

(a) transferring a test tray in a horizontal posture from a loading unit to a test chamber via a soak chamber after semiconductor devices are loaded there on, wherein the horizontal posture of the test tray is changed to a vertical posture at a point while it is transferred;

(b) vertically arranging in three rows three test trays sequentially transferred to the test chamber in the step (a);

(c) transferring the three test trays vertically arranged in the three rows in the step (b) to a test position;

(d) transferring each of the three test trays from the test chamber to an unloading unit via a desoak chamber after a test for semiconductor devices loaded on the three test trays is completed, wherein the vertical posture of the test tray is changed to the horizontal posture at a point while it is transferred; and (e) transferring each of the test trays transferred to the unloading unit in the step (d) to the loading unit after the semiconductor devices are unloaded therefrom, wherein the step (a) includes the steps of:

(a1) transferring the test tray in the horizontal posture from a loading unit into the soak chamber and arranging the test trays sequentially transferred into the soak chamber in two vertical rows, wherein the horizontal posture of the test tray is changed to the vertical posture at a point while it is transferred and arranged; and (a2) translating the test trays that have been arranged in the two vertical rows in the step (a1) to the test chamber; and wherein in the step (a2), the test trays are translated to a middle position and a lower position of the test chamber, and in the step (b), among the three test trays, two test trays sequentially translated to the middle position of the test chamber are arranged at an upper and the middle position in that order and one test tray translated to the lower position of the test chamber is arranged at the lower position.

4. A method for transferring test trays in a side-docking type test handler, the method comprising the steps of:

(a) transferring a test tray in a horizontal posture from a loading unit to a test chamber via a soak chamber after semiconductor devices are loaded there on, wherein the horizontal posture of the test tray is changed to a vertical posture at a point while it is transferred;

(b) vertically arranging in three rows three test trays sequentially transferred to the test chamber in the step (a);

(c) transferring the three test trays vertically arranged in the three rows in the step (b) to a test position;

(d) transferring each of the three test trays from the test chamber to an unloading unit via a desoak chamber after a test for semiconductor devices loaded on the three test trays is completed, wherein the vertical posture of the test tray is changed to the horizontal posture at a point while it is transferred; and (e) transferring each of the test trays transferred to the unloading unit in the step (d) to the loading unit after the semiconductor devices are unloaded therefrom, wherein the step (a) includes the steps of:

(a1) transferring the test tray in the horizontal posture from a loading unit into the soak chamber and arranging the test trays sequentially transferred into the soak chamber in two vertical rows, wherein the horizontal posture of the test tray is changed to the vertical posture at a point while it is transferred and arranged; and (a2) translating the test trays that have been arranged in the two vertical rows in the step (a1) to the test chamber; and wherein in the step (a2), the test trays are translated to an upper and a lower position of the test chamber, and in the step (b), among the three test trays, one test tray translated to the upper position of the test chamber is arranged at the upper position and two test trays sequentially translated to the lower position of the test chamber are arranged at a middle and the lower position in that order.

5. A method for transferring test trays in a side-docking type test handler, the method comprising the steps of:

(a) transferring a test tray in a horizontal posture from a loading unit to a test chamber via a soak chamber after semiconductor devices are loaded there on, wherein the horizontal posture of the test tray is changed to a vertical posture at a point while it is transferred;

(b) vertically arranging in three rows three test trays sequentially transferred to the test chamber in the step (a);

(c) transferring the three test trays vertically arranged in the three rows in the step (b) to a test position;

(d) transferring each of the three test trays from the test chamber to an unloading unit via a desoak chamber after a test for semiconductor devices loaded on the three test trays is completed, wherein the vertical posture of the test tray is changed to the horizontal posture at a point while it is transferred; and (e) transferring each of the test trays transferred to the unloading unit in the step (d) to the loading unit after the semiconductor devices are unloaded therefrom, wherein the step (a) includes the steps of:

(a1) transferring the test tray in the horizontal posture from a loading unit into the soak chamber and arranging the test trays sequentially transferred into the soak chamber in two vertical rows, wherein the horizontal posture of the test tray is changed to the vertical posture at a point while it is transferred and arranged; and (a2) translating the test trays that have been arranged in the two vertical rows in the step (a1) to the test chamber; and wherein in the step (a2), the test trays are translated to an upper and a lower position of the test chamber, and in the step (b), among the three test trays, two test trays sequentially translated to the upper position of the test chamber are arranged at a middle and the upper position in that order and one test tray translated to the lower position of the test chamber is arranged at the lower position.

6. A method for transferring test trays in a side-docking type test handler, the method comprising the steps of:

(a) transferring a test tray in a horizontal posture from a loading unit to a test chamber via a soak chamber after semiconductor devices are loaded there on, wherein the horizontal posture of the test tray is changed to a vertical posture at a point while it is transferred;

(b) vertically arranging in three rows three test trays sequentially transferred to the test chamber in the step (a);

(c) transferring the three test trays vertically arranged in the three rows in the step (b) to a test position;

(d) transferring each of the three test trays from the test chamber to an unloading unit via a desoak chamber after a test for semiconductor devices loaded on the three test trays is completed, wherein the vertical posture of the test tray is changed to the horizontal posture at a point while it is transferred; and (e) transferring each of the test trays transferred to the unloading unit in the step (d) to the loading unit after the semiconductor devices are unloaded therefrom, wherein the step (a) includes the steps of:

(a1) transferring the test tray in the horizontal posture from the loading unit into the soak chamber;

(a2) translating the test tray transferred into the soak chamber in the step (a1) downward to a predetermined position; and (a3) changing the horizontal posture of the test tray to the vertical posture and transferring the test tray in the vertical posture to the test chamber; and wherein in the step (a3), the test tray is transferred to a middle position of the test chamber, and in the step (b), the three test trays sequentially transferred to the test chamber in the step (a3) are arranged at an upper, a lower and the middle position in that order or at the lower, the upper and the middle position in that order.

7. A method for transferring test trays in a side-docking type test handler, the method comprising the steps of:

(a) transferring a test tray in a horizontal posture from a loading unit to a test chamber via a soak chamber after semiconductor devices are loaded there on, wherein the horizontal posture of the test tray is changed to a vertical posture at a point while it is transferred;

(b) vertically arranging in three rows three test trays sequentially transferred to the test chamber in the step (a);

(c) transferring the three test trays vertically arranged in the three rows in the step (b) to a test position;

(d) transferring each of the three test trays from the test chamber to an unloading unit via a desoak chamber after a test for semiconductor devices loaded on the three test trays is completed, wherein the vertical posture of the test tray is changed to the horizontal posture at a point while it is transferred; and (e) transferring each of the test trays transferred to the unloading unit in the step (d) to the loading unit after the semiconductor devices are unloaded therefrom, wherein the step (a) includes the steps of:

(a2) transferring the test tray in the horizontal posture from the loading unit into the soak chamber;

(a2) translating the test tray transferred into the soak chamber in the step (a1) downward to a predetermined position; and (a3) changing the horizontal posture of the test tray to the vertical posture and transferring the test tray in the vertical posture to the test chamber; and wherein in the step (a3), the test tray is transferred to a lower position of the test chamber, and in the step (b), the three test trays sequentially transferred to the test chamber in the step (a3) are arranged in an upper, a middle and the lower position in that order.

\* \* \* \* \*